United States Patent [19]

Warren

[11] Patent Number: 6,088,822

[45] Date of Patent: *Jul. 11, 2000

[54] INTEGRATED CIRCUIT WITH TAP CONTROLLER

[75] Inventor: Robert Warren, Thornbury, United Kingdom

[73] Assignee: SGS-Thomson Microelectronics Limited, Almondsbury Bristol, United Kingdom

[ * ] Notice: This patent issued on a continued prosecution application filed under 37 CFR 1.53(d), and is subject to the twenty year patent term provisions of 35 U.S.C. 154(a)(2).

[21] Appl. No.: 08/959,890

[22] Filed: Oct. 29, 1997

[30] Foreign Application Priority Data

Oct. 31, 1996 [GB] United Kingdom .................... 9622687

[51] Int. Cl.⁷ ..................................................... G01R 31/28
[52] U.S. Cl. ............................................................ 714/726
[58] Field of Search ..................................... 714/726, 724, 714/727, 729, 731, 733, 734, 732, 718, 25, 26, 30, 43, 56

[56] References Cited

U.S. PATENT DOCUMENTS 5,428,624  6/1995  Blair et al. ................................ 714/727
5,590,354  12/1996  Klapproth et al. ......................... 714/30
5,781,558  7/1998  Inglis et al. ............................... 714/718

FOREIGN PATENT DOCUMENTS 0 636 976   2/1995   European Pat. Off. ........ G06F 11/00
0 652 516   5/1995   European Pat. Off. ........ G06F 11/00
0 720 092   7/1996   European Pat. Off. ........ G01F 11/00
WO 91 17505  11/1991  WIPO ............................. G06F 11/26

OTHER PUBLICATIONS

Standard Search Report dated Feb. 28, 1997.

*Primary Examiner*—Trinh L. Tu
*Attorney, Agent, or Firm*—Wolf, Greenfield & Sacks, P.C.; James H. Morris; Theodore E. Galanthay

[57] ABSTRACT

There is disclosed an integrated circuit comprising a test access port controller having a first mode of operation in which it is connectable to test logic to effect communication of serial test data and the control of an incoming clock signal, and a second mode of operation in which a data adaptor is connected to input and output pins via the test access port controller, the data adaptor being supplied with parallel data and control signals from on-chip functional circuitry and converting such parallel data and control signals into a sequence of serial bits including flow control bits.

15 Claims, 5 Drawing Sheets

INTEGRATED CIRCUIT WITH TAP CONTROLLER

FIELD OF THE INVENTION

This invention relates to an integrated circuit, and particularly an integrated circuit which includes a test access port controller (TAP controller) for effecting communication of serial data across the chip boundary.

BACKGROUND OF THE INVENTION

Test access port controllers are known in the art. TAP controllers are used to effect communication of test data on and off chip via what is known as a JTAG port. The functions of known TAP controllers are defined by IEEE Standard 1149.1-1990. That Standard defines test logic which can be included in an integrated circuit to provide standardised approaches to testing the interconnections between integrated circuits, testing the integrated circuit itself, and observing or modifying circuit activities during the integrated circuit's "normal" or "user mode" operation.

According to the IEEE Standard, the TAP controller is capable of implementing a variety of different test modes. In each of these test modes, test data is supplied to the chip via an input pin of the TAP controller, and resultant data following the test is supplied off-chip via an output pin of the TAP controller. The resultant data is dependent on the test data and is compared with expected data to check the validity of the test. The input and output pins are referred to respectively as TDI and TDO. Many existing integrated circuits already incorporate a TAP controller of this type with the input and output pins TDI and TDO.

It is one object of the present invention to make use of these pins and the TAP controller to increase the communication facilities of the integrated circuit without multiplexing the pins and thereby violating the standard.

This is particularly useful for diagnostic purposes. That is, where an integrated circuit includes embedded functional circuitry, for example a processor, it is very difficult using existing diagnostic techniques to provide real time non-intrusive monitoring of the functional circuitry. The functional circuitry need not be a processor but could be other functional circuitry, which might include a DMA (Direct Memory Access) engine, or on-chip cache.

In the past, processors (CPUs) were manufactured as a single chip, requiring off-chip access to all their ancillary circuitry, such as memory. As a result, they had a plurality of access pins so that information about the CPU, in particular memory addressing information, was in any event externally available from these access pins.

In addition to memory addressing information, it is useful to be able to obtain status information about the internal state of the processor to ascertain for example such events as interrupts, changes in streams of instructions, setting of flags in various status registers of the CPU, etc.

Nowadays, chips are more complex and contain not only a processor on-chip but also its associated memory and other ancillary circuitry. Often, there may be more than one processor on a chip, or at least one processor and a DMA (Direct Memory Access) engine or EMI (External Memory Interface) for accessing memory associated with the on-chip processor. Thus, it is no longer a simple matter to monitor the operation of the processor because the signals which are normally available off-chip no longer provide a direct indication as to the internal operation of the CPU(s).

With the increasing complexity of software designed to run on integrated circuit CPUs it is increasingly important to adequately test the software. This requires techniques for monitoring operation of the CPU while it executes the software. It is a particularly onerous requirement that the software be monitored non-intrusively while it is operating in real time.

So-called diagnostic or debugging techniques have been developed in an attempt to achieve this. One existing technique (ICE) involves the manufacture of an emulator board which matches the on-chip hardware and which is connected to it. Thus, the on-chip connections are mapped onto the emulator and are thus accessible on the emulator. However, emulators are complex and expensive to construct and in any event cannot successfully match on-chip communication speeds or conditions. Therefore, it is extremely difficult to truly emulate the on-chip conditions which may prevail.

Another existing technique is to use a logic state analyser (LSA). This is a device connected to the pins of the integrated circuit which monitors continuously the state of all off-chip communications. Each sequentially produced set of states is stored and can then be analysed. Not only is an LSA expensive (although it is less expensive than an emulator), but it requires a large amount of deduction and analysis to derive any useful information from the huge number of sequentially produced state sets which are stored. As it is only possible to analyse the status signals being communicated off-chip, it is inevitably necessary to make some deduction or hypothesis concerning the on-chip situations.

More recently, there have been further developments in an attempt to monitor the operations of "embedded" CPUs. In one integrated circuit, a chain of scan latches is implemented on-chip to transfer data from the registers of the CPU using the on-chip TAP controller. The process is destructive and therefore it is necessary to read data back into the CPU registers before the CPU can continue operating. Thus, in order to implement this it is necessary to stop the CPU so that the status information from its registers can be extracted. This does not therefore satisfy the requirement that the software should be monitored in real time. In some cases, halting the CPU can actually change the way in which the software operates so that a bug which is visible in real time would not be evident if the CPU were halted at that point.

Moreover, the monitoring process is slow because it is necessary to wait for a test scan to be completed to allow all of the scan data from the CPU registers to be transmitted off-chip.

It is therefore another object of the present invention to allow improved diagnostic procedures to be implemented by increasing the facility for external communications off-chip.

SUMMARY OF THE INVENTION

According to one aspect of the present invention there is provided an integrated circuit comprising:

a) a serial data input pin and a serial data output pin;

b) on-chip functional circuitry and test logic;

c) a test access port controller connected to effect communication of serial data across the chip boundary via said input and output pins, the test access port controller being connectable to the test logic in a first mode of operation to effect communication of serial test data under control of an incoming clock signal;

d) a data adaptor which is connectable to the input and output pins via the test access port controller in a second mode of operation;

wherein in the second mode the data adaptor is supplied with parallel data and control signals from said on-chip functional circuitry and converts said parallel data and control signals into a sequence of serial bits including flow control bits and data bits for communicating off chip via the test access port controller under the control of said incoming clock signal, said data adaptor receiving from off chip via the serial data input pin a sequence of serial bits including flow control bits and data bits for conversion into parallel data and control signals for said on-chip functional circuitry.

The data adaptor in the preferred embodiment has first and second ports for receiving and transmitting respectively parallel data and control signals between the data adaptor and the functional circuitry.

The data adaptor preferably includes circuitry for generating flow control information from the flow control bits and the data to be transferred between the functional circuitry and the data adaptor. The flow control information can be one of the following types:

1) forward flow control information generated from flow control bits in the incoming sequence of serial bits and output by at least one pin of the first port;

2) forward data control information which is generated by the on-chip functional circuitry in association with the parallel data signal supplied to the first port;

3) reverse data control information which is generated from data bits in the sequence of serial bits received by the data adaptor; and 4) reverse flow control information which is generated by the on-chip functional circuitry in response to parallel data received thereby.

The forward flow control information can additionally be generated in dependence on the status of a storage circuit in the data adaptor which temporarily holds data and control signals pending their conversion into serial bits.

In the described embodiment, the parallel data signals received and transmitted by the data adaptor are eight bits wide.

The integrated circuits can include various source/destination logic on-chip. In one embodiment, the integrated circuit includes an on-chip bus system to which is connected a message converter which converts requests received from the bus system into parallel data for supply to the data adaptor, and converts parallel data received from the data adaptor into requests for supply via the bus system. The on-chip functional circuitry can comprise at least one processor connected to the bus system. The bus system can include at least one memory bus effecting communications with on-chip or off-chip memory connected or connectable to that memory bus.

The invention also provides a computer system comprising:

a) a single chip integrated circuit including a target processor connected to an on-chip bus system, additional functional circuitry connected to said on-chip bus system, a test access port controller connected to serial data input and output pins and an on-chip data adaptor for effecting communication across the chip boundary via said test access port controller and its serial data input and output pins wherein the on-chip data adaptor is supplied with parallel data and control signals from said on-chip bus system and converts said parallel data and control signals into a sequence of serial bits including flow control bits and data bits for communicating off-chip via said serial data output pin, and receives from off-chip via the serial data input pin a sequence of serial bits including flow control bits and data bits and converts said serial bits into parallel data and control signals for said on-chip bus system;

b) an off-chip host processor operable to generate and receive parallel data and control signals;

c) an off-chip data adaptor connected to the host processor to receive said parallel data and control signals from said host processor and to convert them into a sequence of serial bits including flow control bits and data bits for transmission onto the chip via the serial data input pin, and to receive a sequence of serial bits from the serial data output pin and convert said sequence into parallel data and control signals for the off-chip host processor, whereby the host processor can communicate with said additional functional circuitry via said on-chip bus system without involvement of the target processor.

Thus, communication across the boundary of the integrated circuit can be achieved selectively between the off-chip host processor and the functional circuitry on-chip, preferably without involving a target processor on-chip.

This is particularly useful in a diagnostic environment.

In particular, it allows software running on the target processor to be monitored in real time, because communication on and off chip to the host processor can be done without interrupting real time operation of the target processor. Moreover, the use of the TAP controller and its existing serial input data pin and output data pin saves chip area and overhead in effecting the off-chip communications. The data adaptor serves to modify the parallel format of data and control signals on-chip to a serial format capable of communication via the input and output pins of the TAP controller.

BRIEF DESCRIPTION OF THE DRAWINGS

For a better understanding of the present invention and to show how the same may be carried into effect, reference will now be made by way of example to the accompanying drawings.

DESCRIPTION OF THE PREFERRED EMBODIMENT

Figure 1:
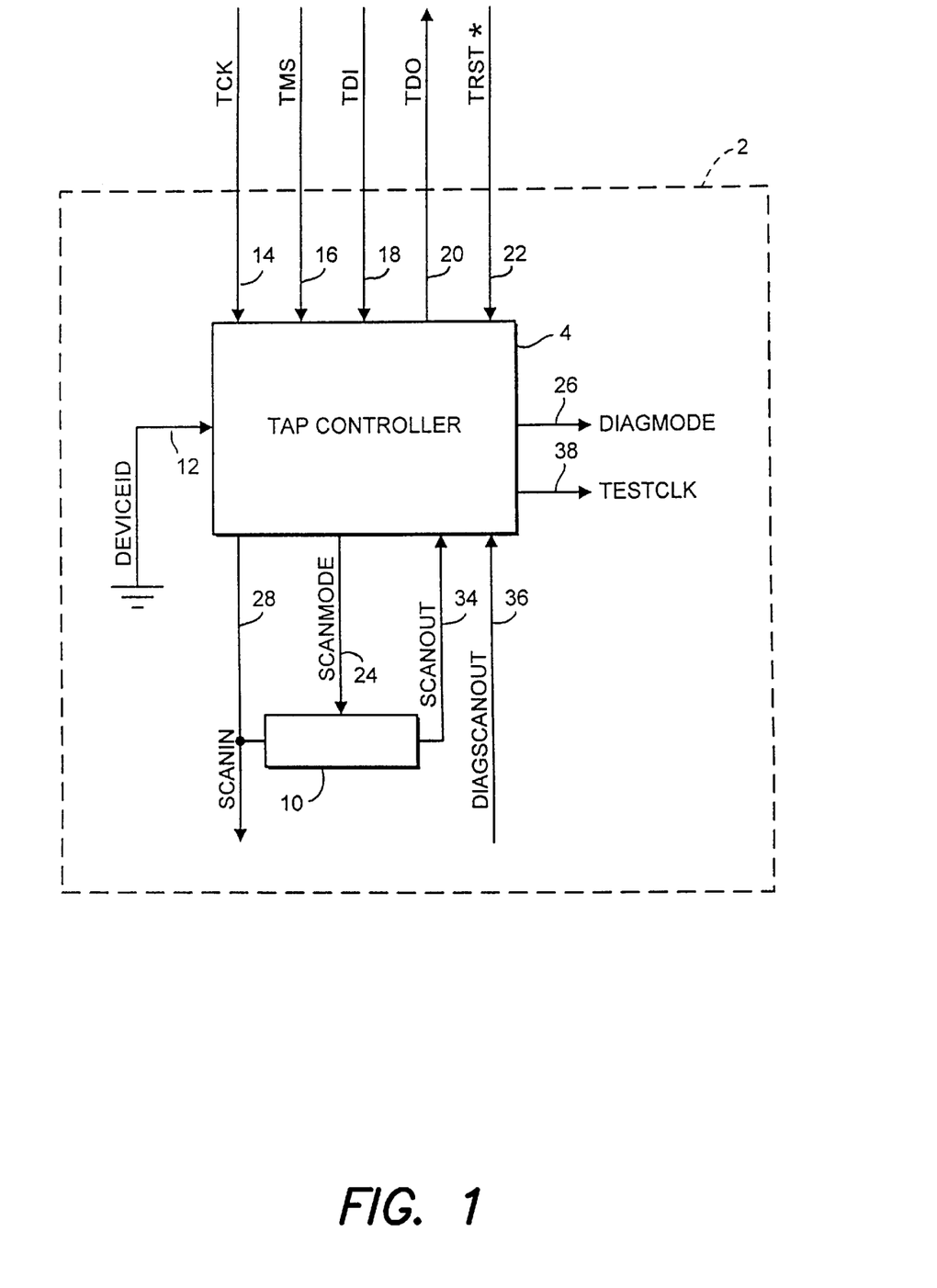
FIG. 1 illustrates an integrated circuit with a test access port controller having connections according to the described embodiment.

FIG. 1 illustrates schematically an integrated circuit 2 including a test access port (TAP) controller 4, and a chip boundary scan chain 10. The TAP controller 4 receives from off-chip a test clock signal TCK on line 14, a test mode select signal TMS on line 16, a test data input signal TDI on line 18, and a test reset input TRST* on line 22. The TAP controller 4 outputs off-chip a test data output signal TDO on line 20. The TAP controller 4 also receives a device identifier signal DEVICEID on line 12. In FIG. 1, the signal DEVICEID is shown as a signal line 12 connected, within the integrated circuit, to ground. The signal line 12 could be a multi-bit wire, and the signal DEVICEID could originate from either on the integrated circuit or off-chip. If the line 12 is a multi-bit wire, then each bit may be connected either to a logic low level or a logic high level on chip. The TAP controller 4 outputs to on-chip circuitry a scan data input signal SCANIN on line 28, a test clock signal TESTCLK on line 38, a signal indicating selection of a scan test mode SCANMODE on line 24, and a signal indicating selection of a diagnostic mode DIAGMODE on line 26. The chip boundary scan chain 10 receives as inputs the scan data input signal SCANIN on line 28 and the signal SCANMODE on line 24, and outputs a scan data output SCANOUT on line 34 to the TAP controller 4. The signal SCANIN on line 28 also is connected to on-chip source/destination logic for diagnostic purposes according to the present invention and will be described hereafter. The source/destination logic provides an input signal DIAGSCANOUT to the TAP controller 4 on line 36 according to the present invention.

Figure 5:
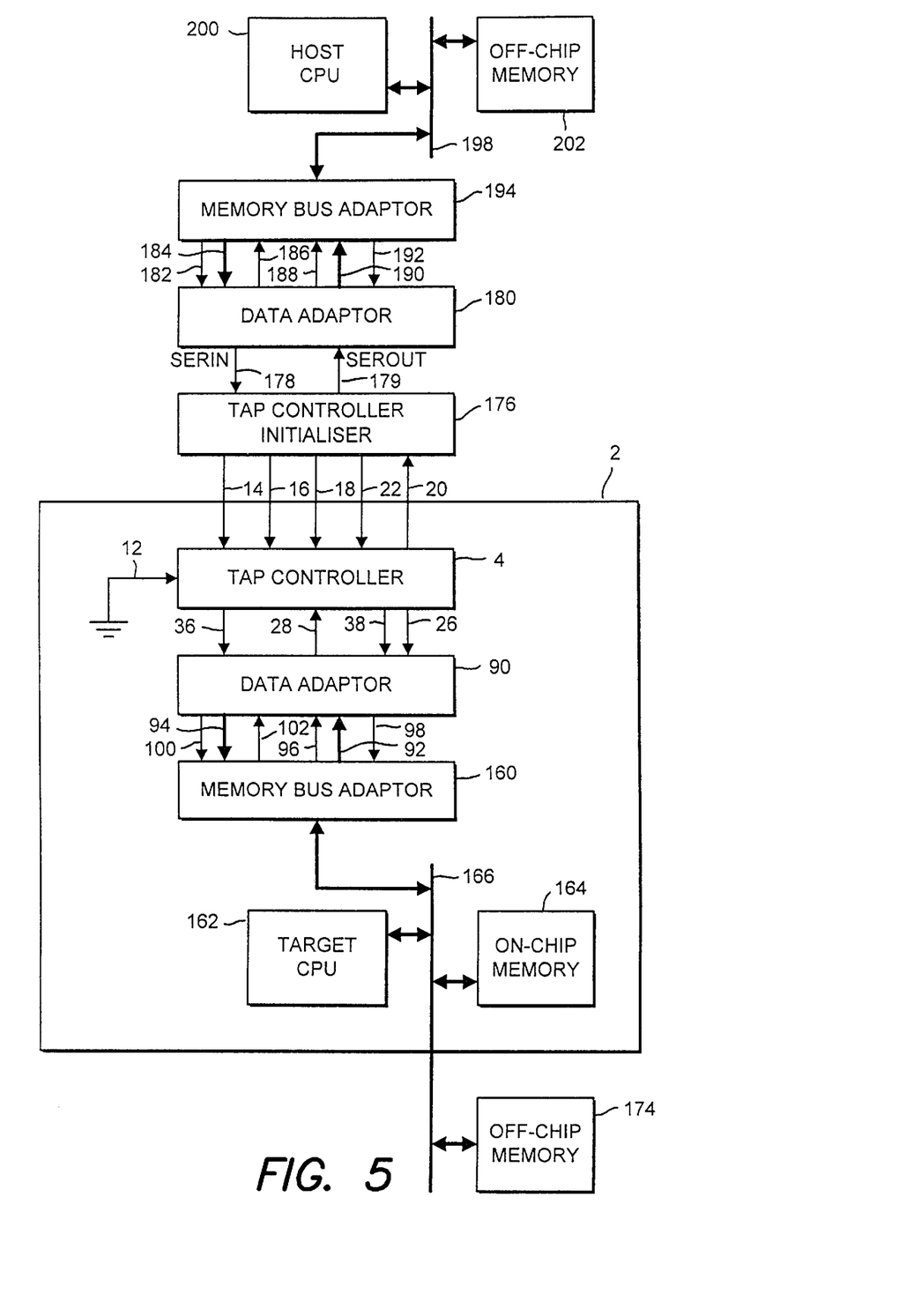
FIG. 5 illustrates in block diagram hierarchical form an implementation of the data adaptor of FIG. 3.

FIG. 5, described in detail hereinbelow, illustrates the components that may constitute the source/destination logic. The source/destination may at least be a processor connected to an on-chip bus system having on-chip memory connected thereto. Off-chip memory may also be connected directly to such a bus system. The on-chip destination/source logic may also include other functional circuitry with a DMA engine or EMI interface.

Figure 2:
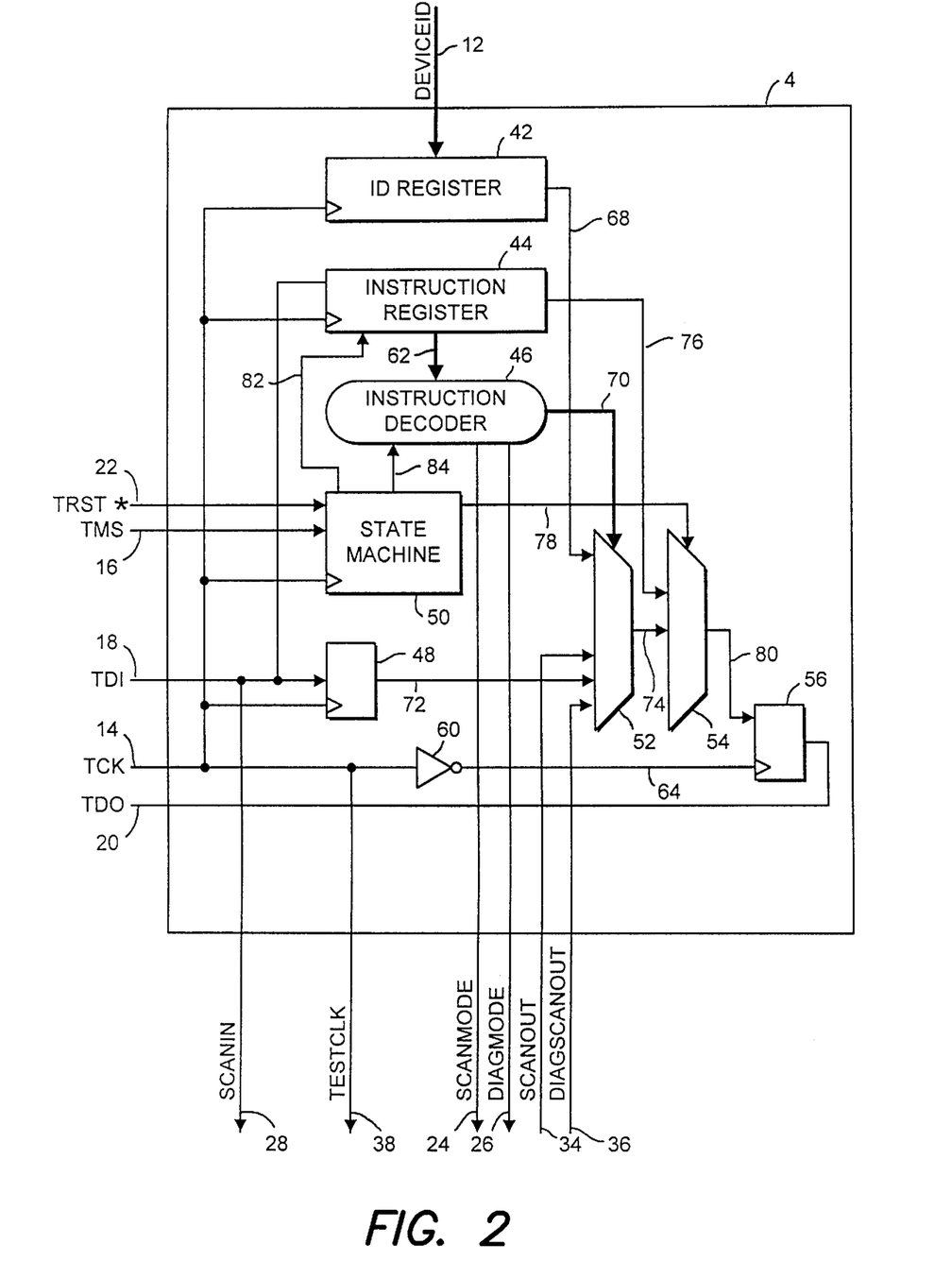
FIG. 2 illustrates the test access port controller of FIG. 1.

The TAP controller 4 is illustrated schematically in FIG. 2 with those circuit blocks essential to its standard operation and as required by the present invention. Referring to FIG. 2, the TAP controller 4, in basic form, comprises a state machine 50, an ID register 42, an instruction register 44, an instruction decoder 46, a bypass latch 48, a data multiplexor 52, an instruction/data multiplexor 54, a latch 56, and an inverter 60. The instruction register receives the test data input signal TDI on line 18, generates a parallel instruction on bus 62 and a serial output on line 76, and receives an instruction control input on line 82. The instruction decoder 46 receives the parallel instruction on bus 62 and a decoder control input on line 84, and generates the signals SCANMODE and DIAGMODE on lines 24 and 26 respectively, and a parallel data multiplexor select signal on line 70. The bypass latch 48 receives the test data input signal TDI on line 18 and generates an output on line 72. The ID register 42 receives the parallel signal DEVICEID on line 12 and generates a serial device identifier output on line 68. The data multiplexor 52 receives the output of the ID register 42 on line 68, the output of the bypass latch 48 on line 72, the SCANOUT signal on line 34, the DIAGSCANOUT signal on line 36 and the data multiplexor select signal on line 70. The data multiplexor 52 generates an output on line 74. The instruction/data multiplexor 54 receives the serial output on line 76, the output of the data multiplexor on line 74, and an instruction/data multiplexor select signal on line 78. The instruction/data multiplexor generates an output on line 80. The latch 56 receives the output of the instruction/data multiplexor 54 on line 80 and generates the test data output signal TDO on line 20. The state machine 50 receives the signal TMS on line 16, and the signal TRST* on line 22. The state machine generates the instruction/data multiplexor select signal on line 78, the instruction control input on line 82, and the decoder control input on line 84. The ID register 42, the instruction register 44, the instruction decoder 46, the bypass latch 48, the state machine 50, and the data converter 57 each receive the test clock signal TCK on line 14. The latch 56 receives the test clock signal TCK inverted via inverter 60 on line 64. The test clock signal TCK and the test data input signal TDI are connected directly as outputs TESTCLK on line 38 and SCANIN on line 28 respectively.

The operation of the TAP controller 4 in performing tests of the integrated circuit 2 is fully explained in IEEE 1149.1-1990. In essence finite length scan chains are formed on the integrated circuit such as that formed by chip boundary scan chain 10.

The TAP controller 4 is a synchronous finite state machine defined by IEEE Standard 1149.1-1990. IEEE Standard 1149.1-1990 defines test logic which can be included in an integrated circuit to provide standardised approaches to testing the interconnections between integrated circuits, testing the integrated circuit itself, and observing or modifying circuit activity during the integrated circuit's normal operation.

During normal operation of the integrated circuit 2, the TAP controller 2 is in a reset state, and all its inputs and outputs are inactive. When a test using the test access port according to IEEE Standard 1149.1-1990 is to be performed, the test access port controller operates according to the definitions of that standard. In such a test mode the test access port controller must be able to select at least one test mode of operation. One possible test mode is a scan test mode, which would be selected by setting the signal SCANMODE on line 24. In the scan test mode a scan chain on the integrated circuit 2 is selected for testing. In this example the chip boundary scan chain 10 is selected by the signal SCANMODE. Such a scan test may simply involve inputting data in at one end of the scan chain, and checking to see that the same data is output at the other end of the scan chain. Alternatively more complex scan operations may be performed, such as scanning in data which is input to functional logic on-chip, functionally clocking the chip for one or more clock cycles, and then scanning out the outputs of the functional logic. Any connection points or circuitry on-chip may be connected for test purposes to form a scan chain. The chip boundary scan chain 10 may be a series of flip-flops which are controlled in test mode to connect all the input/output ports of the integrated circuit 2. A full appreciation of such scan testing can be gathered from reference to IEEE Standard 1149.1-1990. For specific examples of how scan testing may be performed, reference should be made to European Patent Application Publication Nos. 0698890, 0702239, 0702240, 0702241, 0702242, 0702243, 0709688.

A characteristic of known test modes using the test access port of IEEE Standard 1149.1-1990 is that the scan chain is of finite length or closed loop, and that the test data output signal TDO is dependent on the test data input signal TDI, and has a time relationship therewith.

In the described embodiment, the diagnostic mode of operation is provided for carrying out diagnostic procedures of source/destination logic on-chip, which is compatible with IEEE Standard 1149.1-1990. In such a diagnostic test mode, the test data output signal TDO is not dependent on the test data input signal and does not have a time relationship therewith. The chain between the test data input signal TDI and the test data output signal TDO is considered to be of infinite length, or open loop. In the diagnostic mode the TAP controller, whilst continuing to provide all normal functionality, additionally acts as a transport agent carrying full duplex, flow-controlled, unbounded, serial data, although the TAP controller is unaware that this is the form of the data. Conversely the TAP controller normally handles a single stream of data, without any flow control, passing through a selected scan chain.

An overview of the operation of the TAP controller 4 in a test mode will now be given with reference to FIGS. 1 and 2. It should be pointed out that although in FIG. 2 it is shown that the signal SCANIN is connected directly to the test data input signal TDI. In certain circumstances SCANIN may be a modified version of TDI. Similarly although the test clock signal TESTCLK is connected directly to the test clock signal TCK, the signal TESTCLK may in certain circumstances be required to be a modified version of the signal TCK.

In a test mode of operation, the test data input signal TDI and the test mode select signal TMS are supplied in serial fashion to the TAP controller 4 under control of the test clock signal TCK. The state machine 50 acts upon the value of the test mode select signal TMS on each active edge of the test clock signal TCK to cycle through its states accordingly as defined by IEEE Standard 1149.1-1990. The test reset signal TRST* provides for asynchronous initialisation of the TAP controller 4 when in a low logic state in accordance with IEEE Standard 1149.1-1990.

The instruction register 44 is clocked by the test clock signal TCK to load an instruction in serial fashion from the test data input signal TDI under the control of the instruction control input signal on line 82 from the state machine 50. When the instruction has been serially loaded into the instruction register 44, it is transferred in parallel on instruction bus 62 to the instruction decoder 46 under control of the decoder control input signal on line 84 from the state machine 50. In accordance with the instruction stored therein, the instruction decoder will set one of either the SCANMODE signal or the DIAGMODE signal in accordance with whether it is a scan test or a diagnostic test which is to be performed. The loading of the instruction register 44 and the instruction decoder 46 are controlled by the state machine 50 in accordance with IEEE Standard 1149.1-1990. In accordance with the instruction decoded by the instruction decoder 46, and as described further hereinafter, the parallel output on line 70 of the instruction decoder 46 controls the data multiplexor 52 to connect one of its inputs to the output line 74. Similarly the output on line 78 of the state machine 50 controls the instruction/data multiplexor to connect one of its inputs to the output on line 80.

The ID register 42 receives the DEVICEID signal in parallel on lines 12. The ID register 42 stores a chip identifier which can be scanned out of the ID register 42 via line 68 to the test data output signal TDO. The chip identifier identifes the integrated circuit 2.

In one mode of operation the instruction decoded by the instruction decoder 46 may be simply to output the identity of the device, in which case the multiplexor 52 is controlled to connect its input on line 68 to its output on line 74, and the instruction/data multiplexor 54 is controlled to connect its input on line 74 to its output on line 80. The identity of the device is then serially output as the signal TDO.

In another mode of operation it may be required to output the current instruction on the test data output signal TDO, in which event the serial output on line 76 is connected by the instruction/data multiplexor 54 to the line 80.

In one mode of test operation, it may be required that the TAP controller 4 of a particular integrated circuit 2 merely connect the test data input signal TDI to the test data output signal TDO. In this mode of operation the data multiplexor is controlled to connect the output of the bypass flip-flop on line 72 to the output on line 74, and the instruction/data multiplexor is controlled to connect the line 74 to the output line 80. Thus the test data input signal TDI is connected to the test data output signal TDO via the flip-flop 56.

The latch 56 is merely a flip-flop provided only to allow timing control of the test data output signal TDO so that such signal can be synchronised to the negative edge of the test clock signal TCK.

If the test mode to be carried out is a scan test mode, then the instruction decoder 46 sets the signal SCANMODE. The data multiplexor 52 is controlled by the instruction decoder 46 to connect the signal SCANOUT to the output line 74. The instruction/data multiplexor 54 is also controlled to connect the line 74 to the line 80 so as to output the signal SCANOUT as the test data output signal TDO. During such a scan test mode test data is scanned into the selected scan chain on the SCANIN signal which is connected directly to the test data input signal TDI. Scan testing, in particular boundary scan testing, is fully described in IEEE Standard 1149.1-1990. It will be appreciated that additional control signals, in accordance with the test to be performed, need to be supplied to the selected scan chain to achieve the required test operation.

In the described embodiment a diagnostic mode may also be entered, in which case the instruction decoder 46 sets the signal DIAGMODE on the output line 26. Furthermore, the data multiplexor 52 will be controlled to connect the signal DIAGSCANOUT on line 36 to the output on line 74, which in turn is connected to the line 80 through the instruction/data multiplexor 54 and to the test data output signal TDO via the flip-flop 56.

In diagnostic mode, the serial data flow between the test data input signal TDI and the test data output signal TDO may be considered to pass through a shift register of infinite length as opposed to the scan test mode, in which mode the serial data flow is through a shift register (shift register chain) of finite length. In the diagnostic mode, a sequence of bit patterns shifted into the test access port as the test data input signal TDI are never reflected in the sequence of bit patterns shifted out of the test access port as the test data output signal. The communication of diagnostic data may include memory access requests from host to target and target to host (reads and writes); status information of CPU registers; data read from host memory or target memory in response to a memory access request; status data for loading into CPU registers; and information about memory addresses being accessed by the target CPU. Thus the diagnostic mode may involve non-intrusive monitoring of data, or intrusive loading of data.

In the diagnostic mode the serial data shifted into the test access port is a uni-directional serial data stream which can be encoded in any desired means, for example, with start and stop bits to delineate data chunks. Likewise, data shifted out via the test access port is a uni-directional serial data stream which can be encoded in any desired means, for example with start and stop bits to delineate data chunks. Normally the data shifted in and the data shifted out will be encoded in the same way. The input and output uni-directional data streams may be used simultaneously to allow full-duplex, bidirectional, serial communications. The sequence of serial data bits could constitute a byte of information.

Figure 3:
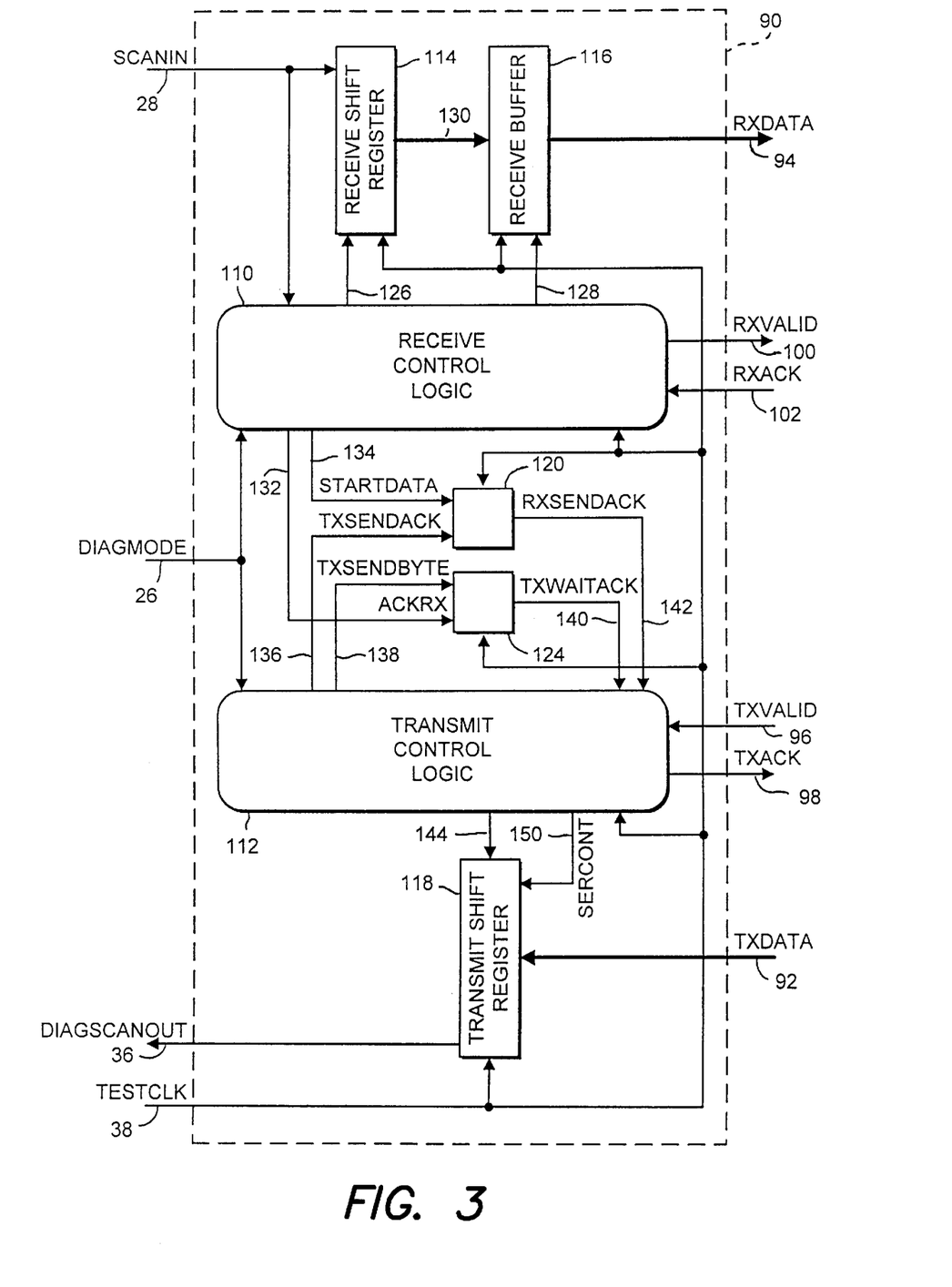
FIG. 3 illustrates a data adaptor according to the described embodiment for connection to the test access port controller of FIG. 2.

In the described embodiment, when provided with a diagnostic mode of operation in addition to a normal test mode, the integrated circuit 2 is preferably provided, as shown in FIG. 3, with a data adaptor 90 to interface between the TAP controller 4 and on-chip source/destination logic. The data adaptor 90 receives as inputs from the TAP controller 4 the scan data input signal SCANIN on line 28, the test clock signal TESTCLK on line 38 and the signal indicating selection of the diagnostic mode DIAGMODE on line 26. The data adaptor 90 outputs to the TAP controller 4 the signal DIAGSCANOUT on line 36. The data adaptor receives data from on-chip source/destination logic on a transmit data bus TXDATA on line 92, and outputs data to on-chip source/destination logic on a receive data bus RXDATA on line 94. The data adaptor 90 inputs a transmit valid signal TXVALID on line 96, and outputs a transmit acknowledge signal TXACK on line 98, both of which signals are control signals associated with the transmit data bus TXDATA. The data adaptor 90 outputs a receive valid signal RXVALID on line 100 and inputs a receive acknowledge signal RXACK on line 102, both of which signals are control signals associated with the receive data bus RXDATA.

The data adaptor 90 comprises a receive shift register 114, a receive buffer 116, receive control logic 110, a receive flow control status flip-flop 120, a transmit flow control status flip-flop 124, a transmit shift register 118, and transmit control logic 112. The receive shift register 114 receives the signal SCANIN on line 28 and a control signal from the receive control logic on line 126, and outputs data in parallel on bus 130 to form an input to the receive buffer 116. The receive buffer additionally receives a control signal from the receive control logic on line 128 and generates the receive data bus signal RXDATA on line 94. The receive control logic additionally generates the signal RXVALID on line 100, receives the signal RXACK on line 102, receives the signal DIAGMODE on line 26, and generates signals STARTDATA and ACKRX on lines 134 and 132 respectively. The receive flow control status flip-flop 120 receives the signal STARTDATA and a signal TXSENDACK on line 136, and outputs a signal RXSENDACK to the transmit control logic on line 142. The transmit flow control status flip-flop 124 receives the signal ACKRX and a signal TXSENDBYTE on line 138, and outputs a signal TXWAITACK to the transmit control logic on line 140. The transmit control logic 112 additionally receives the signal DIAGMODE on line 26 and the signal TXVALID on line 96, and outputs the signal TXACK on line 98, a control signal to the transmit shift register 118 on line 144, and a parallel signal SERCONT on line 150 to the transmit shift register 118. The transmit shift register 118 additionally receives the parallel data bus TXDATA on lines 92, and outputs the signal DIAGSCANOUT on line 36.

The data adaptor may optionally be provided with an input from the on-chip system clock, although this connection is not shown in any of the figures. The system clock may be used for synchronous implementations where the data and control signals between the data adaptor and the on-chip destination/source logic must be synchronous with the clock of the on-chip destination/source logic. The data adaptor 90 performs synchronisation of serial data from the TAP controller clocked by the signal TESTCLK (derived from the signal TCK) to the clock environment of the internal functionality of the destination/source logic, and to the TAP controller clocked by the signal TESTCLK from the clock environment of the internal destination/source logic. The TAP controller 4 may optionally provide a scan enable signal to the data adaptor 90, which signal is also not shown in the figures. Such a scan enable signal indicates that the TAP controller has selected this scan path for data output onto the test data output signal TDO.

The data adaptor converts the uni-directional serial data from off-chip through the TAP controller 2 into a format more suited for use by the on-chip destination/source logic. Conversely the data adaptor must convert the data format supplied by the on-chip destination/source logic into unidirectional serial data. In the preferred embodiment, it is desired to provide data to the on-chip destination/source logic in the form of eight parallel bits, or a byte, of data. However, in the extreme the receive data bus RXDATA and the transmit data bus TXBUS could be only one bit, rather than a byte, wide. It is also envisaged that the receive and transmit data buses RXBUS and TXBUS could be multiple byte wide buses.

The data adaptor 90 must perform the function of "flow control" of both receive and transmit data. Serial data may only be passed through the TAP controller 4 (in either direction) when the receiving end has capacity available to receive that data to prevent data loss or corruption. The communication of the fact that the receiving end is ready to receive more data is achieved by transmitting such information in the reverse direction. This constitutes the flow control protocol. The data adaptor 90 according to the described embodiment provides for the unidirectional serial data to be converted into parallel format for communication with the on-chip destination/source logic. Thus a flow control protocol is also necessary between the data adaptor 90 and the on-chip destination/source logic.

This flow control must thus be performed across two boundaries: the boundary between the TAP controller 4 and the data adaptor 90; and the boundary between the data adaptor 90 and the on-chip destination/source logic to which the data adaptor 90 interfaces.

Figure 4A:
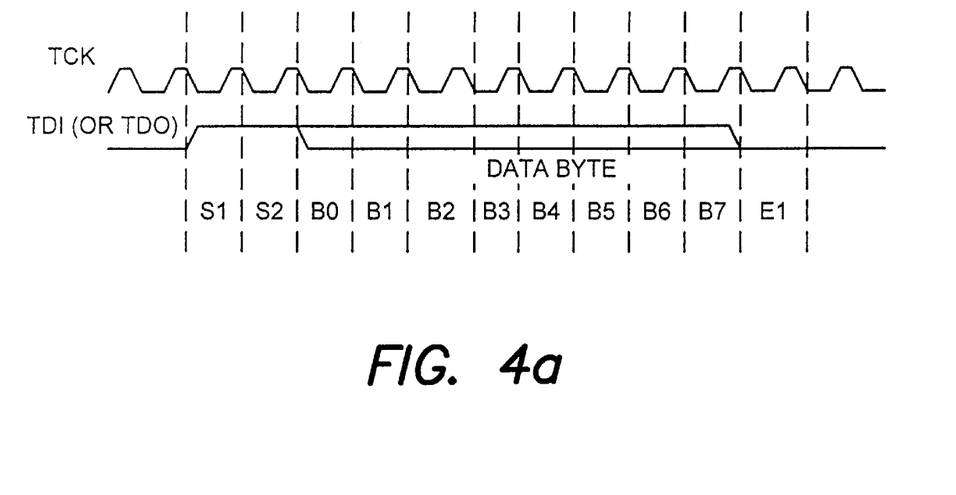
FIGS. 4(a) and 4(b) illustrate the data format for data communicated off-chip via the test access port controller of FIG. 2 in a diagnostic mode.

To provide flow control between the TAP controller 4 and the data adaptor 90 the unidirectional data on the test data input signal TDI line and the test data output signal line are encoded with start and stop bits as shown in FIG. 4a. The bit flow control protocol is return to zero (RTZ) signalling with two start bits S1 and S2, and a stop bit E1. In between the start bits and the stop bit is included a byte of data. Serial data in this format is passed from the test data input TDI of the TAP controller to the SCANIN signal on line 28 and input to the data adaptor 90. The receive control logic 110 of the data adaptor receives the serial data signal SCANIN. When the receive control signal recognises two successive serial bits as being the start bits S1 and S2, the receive shift register 114 is controlled on the line 126 to serially load the next eight successive bits, which form a data byte, therein.

Figure 4B:
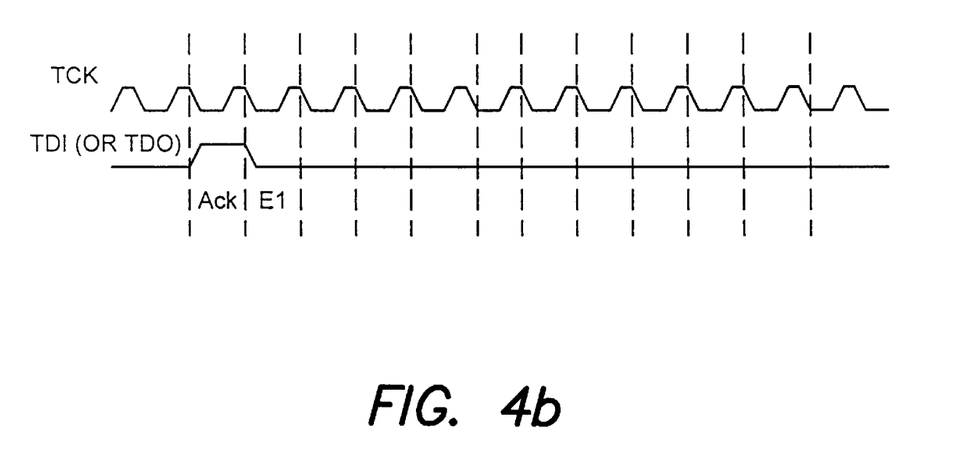

In response to the two consecutive start bits S1 and S2, the receive control logic 110 also sets the signal STARTDATA on line 134, which sets the receive flow control status flip-flop 120. When set, the receive flow control status flip-flop 120 in turn sets the signal RXSENDACK on line 142, which signal causes the transmit control logic 112 to send an acknowledgement signal on the test data output signal TDO in the form shown in FIG. 4b, which signal comprises only a start acknowledge bit ACK and a stop bit E1. These bits are loaded directly into the transmit shift register in parallel as the signal SERCONT on line 150 under the control of the signal on line 144, and output from the transmit shift register in serial fashion in the form of FIG. 4b, as the signal DIAGSCANOUT. Once the acknowledgement signal has been sent, the transmit control logic 112 sets the signal TXSENDACK on line 136 to reset the receive flow control status flip-flop and thereby reset the signal RXSENDACK.

The signal SERCONT, in accordance with the flow control protocol used in this embodiment, is a 3 bit signal which enables the start bits S1,S2 and the stop bit E1 to be loaded directly into the transmit shift register 118. When a byte of data is presented by the on-chip destination logic, to be output through the TAP controller 4, is present on the transmit data bus TXDATA it is loaded in parallel under the control of the transmit control logic 112 into the transmit shift register 118, and the transmit control logic 112 directly loads the start bits S1,S2 and the stop bit E1 forming signal SERCONT into the appropriate bit positions in the transmit shift register prior to serially shifting a signal in the format shown in FIG. 4a. When sending an acknowledgement signal the transmit control logic 118 directly loads a single start bit and a stop bit into the transmit shift register, and then serially shifts them out.

When the receive control logic 110 receives the stop bit E1 on the signal SCANIN, the data byte has been loaded into the receive shift register 114, and under the control of the receive control logic 110 the data byte is transferred on bus 130 from the receive shift register 114 to the receive buffer 116. When a data byte has been loaded into the receive buffer 116 it is output on the bus RXDATA under control of the receive logic 110, which also sets the signal RXVALID on line 100. The destination/source logic on-chip, responsive to the signal RXVALID, accepts the data byte on the RXBUS and indicates this acceptance by setting the signal RXACK on line 102. In response to the signal RXACK the receive control logic 110 resets the signal RXVALID, and if there is a further data byte in the receive shift register 114 transfers this to the receive buffer 116 before again setting the signal RXVALID.

The receive buffer 116 is provided in the preferred embodiment. This allows acknowledge tokens, which overlap the reception of data, to be transmitted as soon as the two start bits have been received, and this also supports efficient data transfer rates by allowing successive bytes to be transferred without any gap between each byte. Data buffering may also be provided on the transmit side.

The destination/source logic on-chip transfers data bytes in parallel to the data adaptor 90 on the TXDATA bus 92. When the destination/source logic on-chip has a byte of data to be transmitted, the signal TXVALID on line 96 is set. In response to the signal TXVALID being set, the transmit control logic controls the transmit shift register 118 via line 144 to load the data byte on the TXDATA bus in parallel. In addition, using lines 150 the transmit control logic loads the appropriate start bits S1 and S2 and the stop bit E1 into the transmit shift register 118. Then, again under the control of the signal 144, the data byte including two start bits and a stop bit is serially shifted out of the transmit shift register as signal DIAGSCANOUT, which is connected through the TAP controller to the signal TDO. When the data byte on the bus TXDATA is loaded into the shift register, the transmit control logic sets the signal TXACK on line 98 to acknowledge receipt of the data byte to the destination logic on-chip. The destination logic on-chip can then transmit a further byte of data. Data buffering may be provided in association with the transmit shift register if desired.

When the transmit shift register 118 is controlled by the transmit control logic 112 to output serial data in the form shown in FIG. 4a, the transmit control logic 112 also sets the signal TXSENDBYTE on line 138, which sets the transmit flow control status flip-flop 124. In response to this signal, the transmit flow control status flip-flop 124 sets the signal TXWAITACK on line 140. Whilst the TXWAITACK signal is set, the transmit control logic is waiting for an acknowledgement from the destination/source logic off-chip that the data byte set has been received. If the destination/source logic off-chip successfully receives the transmitted data byte then it sends on the test data input signal TDI an acknowledgement signal of the type shown in FIG. 4b. Upon receipt of such an acknowledgement signal as the SCANIN signal on line 28, the receive control logic 110 will set the signal ACKRX on line 132, causing the transmit flow control status flip-flop 124, and consequently the signal TXWAITACK, to be reset. The transmit control logic 112 is then prepared to receive and transmit the next parallel data byte from the source/destination logic on-chip.

FIG. 5 illustrates in schematic form how the data adaptor 90 may be used to establish a connection between a host memory and a target memory. The integrated circuit 2 comprises the TAP controller 4 and the data adaptor 90 which communicate between each other, off-chip, and with circuitry on-chip using signals as described hereinabove. The same reference numerals are used in FIG. 5 to denote signals which correspond to those already described. As can be seen in FIG. 5 the integrated circuit 2 also comprises a memory bus adaptor 160, a target CPU 162, and an on-chip memory 164. The integrated circuit 2 is provided with a memory bus 166 which interfaces with the target CPU 162 and the on-chip memory 164. The memory bus 166 is also connected to off-chip memory 174. Off-chip the test access port signals TCK,TMS,TDI,TDO and TRST* are connected to a TAP controller initialliser 176, which itself receives a serial data input signal SERIN on line 178 from a further data adaptor 180 and outputs a serial data output signal SEROUT on line 179 to the further data adaptor 180. The further data adaptor 180 outputs signals EXTRXDATA, EXTRXVALID, and EXTTXACK on lines 190,188 and 186 respectively to a further memory bus adaptor 194, and receives signals EXTTXDATA, EXTTXVALID, and EXTRXACK on lines 184,182 and 192 respectively from the further memory bus adaptor 194. The memory bus adaptor 194 is connected to an external memory bus 198. A host CPU 200 is connected to the external memory bus 198 and a further off-chip memory 202 is connected to the external memory bus 198.

The TAP controller initialiser 176 configures the TAP controller 4 for operation either in the test mode or the diagnostic mode. The memory bus adaptors 160 and 194 adapt the parallel data on the bus RXDATA to a message format more suitable for communication with the on-chip destination/source logic. The memory bus adaptors are therefore message converters, and may be message converters of the type described in GB Application No. 9622685.7. The memory bus adaptors must also convert the message format of the on-chip destination/source logic into parallel data bytes for transmission of the bus TXDATA.

The structure of FIG. 5 can be used to implement various diagnostic procedures. The serial links on and off chip can allow the communication of various different types of diagnostic data between the integrated circuit 2 and the host CPU 200.

The host CPU can access the on-chip memory 164 or the off-chip memory 174 using the on-chip bus system 166 but without involving the target CPU 162. To do this, a memory access request made by the host CPU can be transmitted via the interfacing circuitry comprising the off-chip memory bus adaptor 194, data adaptor 180 and TAP controller initialiser 176 and the on-chip TAP controller 4, data adaptor 90 and memory bus adaptor 160, undergoing the various conversions discussed herein. Similarly, data read from the on-chip memory 164 or off-chip memory 174 can be returned via the on-chip bus system 166 and the interface circuitry to the host CPU. Conversely, the target CPU may access the off-chip memory 202 associated with the host CPU. Data read from the off-chip memory 202 associated with the host CPU 200 can likewise be returned via the interface circuitry.

In addition, the target CPU can be monitored for diagnostic purposes. For example, its accesses to its own memory can be monitored by on-chip circuitry and information about the memory addresses which have been accessed can be transmitted to the host CPU using the interface circuitry. Moreover, the target CPU contains or has access to configuration registers which represent its status. Information about the content of these registers can be transmitted off-chip to the host CPU using the interface circuitry. Conversely, particular status information can be loaded into these registers to affect that state of the target CPU under the instruction of the host CPU.

Thus, the interface circuitry discussed herein allows the communication of diagnostic data including memory access requests from host to target and target to host (reads and writes); status information of CPU registers; data read from host memory or target memory in response to a memory access request; status data for loading into CPU registers; and information about memory addresses being accessed by the target CPU.

Thus, the interface circuitry allows the following diagnostic features to be provided in the circuit:

the facility to implement real time diagnostic procedures, that is while the target CPU is operating in real time and without intruding on its operation while the diagnostic procedures are taking place. In particular, monitoring of the memory bus and accesses to the target memory can be undertaken by the host CPU without involving the target CPU;

access to target memory and configuration registers from host;

access to host memory from target;

control of target CPU and sub-systems, including the facility to effect booting operations of the CPU from the host processor.

What is claimed is:

1. An integrated circuit, comprising:
   a) a serial data input pin and a serial data output pin;
   b) on-chip functional circuitry and test logic;
   c) a test access port controller connected to effect communication of serial data across the chip boundary via said input and output pins, the test access port controller being connectable to the test logic in a first mode of operation to effect communication of serial test data under control of an incoming clock signal;
   d) a data adaptor which is connectable to the input and output pins via the test access port controller in a second mode of operation;
   wherein in the second mode the data adaptor is supplied with parallel data and control signals from said on-chip functional circuitry and includes first conversion circuitry for converting said parallel data and control signals into a sequence of serial bits including flow control bits and data bits for communicating off chip via the test access port controller under the control of said incoming clock signal, wherein the flow control bits are generated responsive to receipt of said parallel data and control signals from said on-chip functional circuitry, said data adaptor receiving from off chip via the serial data input pin a sequence of serial bits including flow control bits and data bits and including second conversion circuitry for converting said sequence of serial bits into parallel data and control signals for said on-chip functional circuitry, the control signals being generated responsive to receipt of said flow control bits.

2. An integrated circuit according to claim 1, wherein the data adaptor has a first port for receiving parallel data and control signals from said on-chip functional circuitry and a second port for transmitting parallel data and control signals to said on-chip functional circuitry.

3. An integrated circuit according to claim 2, wherein the data adaptor includes circuitry for generating forward flow control information from flow control bits in the incoming sequence of serial bits, and wherein the first port includes at least one pin for transmitting said forward flow control information to said on-chip functional circuitry.

4. An integrated circuit according to claim 2, wherein the first port includes at least one pin for receiving forward data control information from the on-chip functional circuitry, said forward data control information having been generated by the on-chip functional circuitry in association with the parallel data signals supplied to the first port.

5. An integrated circuit according to claim 2, wherein the data adaptor comprises circuitry for generating reverse data control information from data bits in the sequence of serial bits received by the data adaptor and in association with the parallel data signals generated to be supplied to the on-chip functional circuitry, and wherein the second port includes at least one pin for transmitting said reverse data control information to the on-chip functional circuitry.

6. An integrated circuit according to claim 2, wherein the second port includes at least one pin for receiving reverse flow control information generated by the on-chip functional circuitry in response to parallel data received thereby.

7. An integrated circuit according to claim 1, wherein the data adaptor comprises a storage circuit for temporarily holding data and control signals from said on-chip functional circuitry pending their conversion into serial bits for transmission off-chip.

8. An integrated circuit according to claim 7, wherein the forward flow control information is derived additionally from the status of the contents of the storage circuit in the data adaptor.

9. An integrated circuit according to claim 1, wherein the parallel data signals received and transmitted by the data adaptor are eight bits wide.

10. An integrated circuit according to claim 1, which comprises an on-chip bus system.

11. An integrated circuit according to claim 10, wherein the on-chip functional circuitry includes a message converter connected to said on-chip bus system and which converts requests received from the bus system into said parallel data for supply to the data adaptor, and converts parallel data received from the data adaptor into requests for supply via the bus system.

12. An integrated circuit according to claim 10, wherein the on-chip functional circuitry comprises a processor connected to said bus system.

13. An integrated circuit according to claim 10, wherein the bus system includes at least a memory bus for effecting communications with on-chip or off-chip memory.

14. A computer system comprising an integrated circuit according to claim 10, an off-chip host processor and an off-chip data adaptor connected to the host processor for allowing communication across the boundary of the integrated circuit selectively between the off-chip host processor and the functional circuitry connected to the on-chip bus system.

15. A computer system, comprising:
   a) a single chip integrated circuit including a target processor connected to an on-chip bus system, additional functional circuitry connected to said on-chip bus system, a test access port controller connected to serial data input and output pins and an on-chip data adaptor for effecting communication across the chip boundary via said test access port controller and its serial data input and output pins wherein the on-chip data adaptor is supplied with parallel data and control signals from said on-chip bus system and includes first conversion circuitry for converting said parallel data and control signals into a sequence of serial bits including flow control bits and data bits for communicating off-chip via said serial data output pin, wherein the flow control bits are generated responsive to receipt of said parallel data and control signals, said data adaptor receiving from off-chip via the serial data input pin a sequence of serial bits including flow control bits and data bits and including second conversion circuitry for converting said sequences of serial bits into parallel data and control signals for said on-chip bus system, the control signals being generated responsive to the receipt of said flow control bits;

b) an off-chip host processor operable to generate and receive parallel data and control signals;

c) an off-chip data adaptor connected to the host processor to receive said parallel data and control signals from said host processor and to convert them into a sequence of serial bits including flow control bits and data bits for transmission onto the chip via the serial data input pin, and to receive a sequence of serial bits from the serial data output pin and convert said sequence into parallel data and control signals for the off-chip host processor, whereby the host processor can communicate with said additional functional circuitry via said on-chip bus system without involvement of the target processor.

* * * * *